(12) United States Patent
Kee et al.

(10) Patent No.: US 6,911,388 B2
(45) Date of Patent: Jun. 28, 2005

(54) INDIVIDUAL SELECTIVE REWORK OF DEFECTIVE BGA SOLDER BALLS

(75) Inventors: Kwan Yew Kee, Singapore (SG); Chew Boon Ngee, Singapore (SG); Keith Wong Bing Chiang, Singapore (SG)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/661,960

(22) Filed: Sep. 11, 2003

(65) Prior Publication Data

US 2004/0056078 A1 Mar. 25, 2004

Related U.S. Application Data

(63) Continuation of application No. 09/694,113, filed on Oct. 20, 2000, now Pat. No. 6,685,080.

(30) Foreign Application Priority Data

Sep. 21, 2000 (SG) .......................... 200005401

(51) Int. Cl.[7] .............................................. H01L 21/44
(52) U.S. Cl. ....................................... 438/613; 438/612
(58) Field of Search ................................ 438/613, 612; 219/388

(56) References Cited

U.S. PATENT DOCUMENTS

| | | |
|---|---|---|
| 3,903,581 A | 9/1975 | Michel |
| 4,526,646 A | 7/1985 | Suzuki et al. |
| 4,543,659 A | 9/1985 | Ozaki |
| 4,736,437 A | 4/1988 | Sacks et al. |
| 4,871,110 A | 10/1989 | Fukasawa et al. |
| 4,898,117 A | 2/1990 | Ledermann et al. |
| 4,899,921 A | 2/1990 | Bendat et al. |
| 4,912,843 A | 4/1990 | Dederer |
| 4,934,582 A | 6/1990 | Bertram et al. |
| 5,059,559 A | 10/1991 | Takahashi et al. |
| 5,088,639 A | 2/1992 | Gondotra et al. |
| 5,113,565 A | 5/1992 | Cipolla et al. |
| 5,145,099 A | 9/1992 | Wood et al. |
| 5,194,948 A | 3/1993 | L'Esperance, III et al. |
| 5,238,174 A | 8/1993 | Ricketson et al. |
| 5,284,287 A | 2/1994 | Wilson et al. |
| 5,288,698 A | 2/1994 | Banjo et al. |
| 5,425,493 A | 6/1995 | Interrante et al. |
| 5,445,313 A | 8/1995 | Boyd et al. |
| 5,463,227 A | 10/1995 | Stern et al. |
| 5,467,913 A | 11/1995 | Namekawa et al. |
| 5,471,310 A | 11/1995 | Spigarelli et al. |
| 5,478,009 A | 12/1995 | Interrante et al. |
| 5,492,266 A | 2/1996 | Hoebener et al. |
| 5,506,385 A | 4/1996 | Murakami et al. |
| 5,506,684 A | 4/1996 | Ota et al. |

(Continued)

FOREIGN PATENT DOCUMENTS

JP          2000-133931 A      5/2000

*Primary Examiner*—David Nelms
*Assistant Examiner*—Thao P. Lee
(74) *Attorney, Agent, or Firm*—TraskBritt, PC

(57) ABSTRACT

A method for reworking a ball grid array (BGA) of solder balls is provided including one or more defective solder balls on an electronic component workpiece using a single-ball extractor/placer apparatus having a heatable capillary tube pickup head optionally augmented with vacuum suction. A defective solder ball is identified, extracted by the pickup head and disposed of. A nondefective solder ball is picked up by the pickup head, positioned on the vacated attachment site, and thermally softened for attachment to the workpiece. Flux may be first applied to the replacement solder ball or to the vacated attachment site. The extractor/placer apparatus may be automated to locate, extract and replace defective balls for completion of a fully operable BGA.

33 Claims, 6 Drawing Sheets

U.S. PATENT DOCUMENTS

| | | | |
|---|---|---|---|
| 5,516,023 A | 5/1996 | Kono | |
| 5,516,026 A | 5/1996 | Ariye et al. | |
| 5,543,584 A | 8/1996 | Handford et al. | |
| 5,615,823 A | 4/1997 | Noda et al. | |
| 5,644,245 A | 7/1997 | Saitoh et al. | |
| 5,680,984 A | 10/1997 | Sakemi | |
| 5,685,477 A | 11/1997 | Mallik et al. | |
| 5,687,901 A | 11/1997 | Hoshiba et al. | |
| 5,695,667 A | * 12/1997 | Eguchi et al. | 219/388 |
| 5,826,779 A | 10/1998 | Jacks et al. | |
| 5,831,247 A | 11/1998 | Hidaka | |
| 5,894,218 A | 4/1999 | Farnworth et al. | |
| 5,904,868 A | 5/1999 | Economikos et al. | |
| 6,009,145 A | 12/1999 | Zweig et al. | |
| 6,119,337 A | * 9/2000 | Furuno | 29/832 |
| 6,151,380 A | 11/2000 | Zweig et al. | |
| 6,156,150 A | 12/2000 | Nishida | |
| 6,177,682 B1 | 1/2001 | Bartulovic et al. | |
| 6,386,433 B1 | 5/2002 | Razon et al. | |
| 6,422,923 B2 | 7/2002 | Hembree | |
| 2001/0011828 A1 | 8/2001 | Ujita et al. | |

* cited by examiner

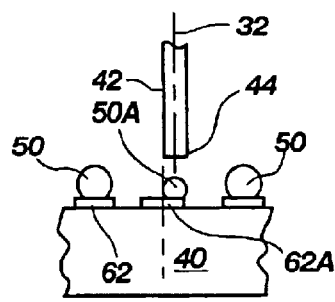
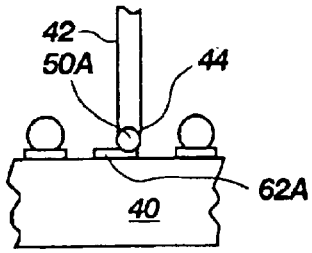
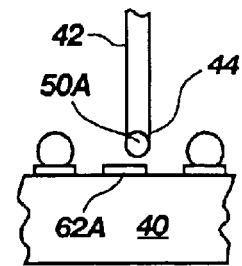
Fig. 5  Fig. 6  Fig. 7
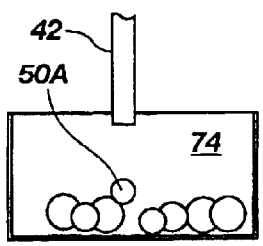
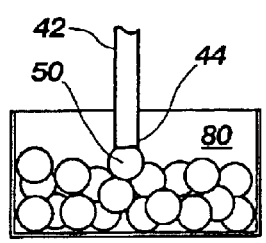
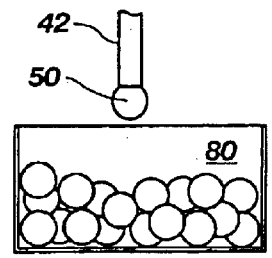
Fig. 8  Fig. 9  Fig. 10
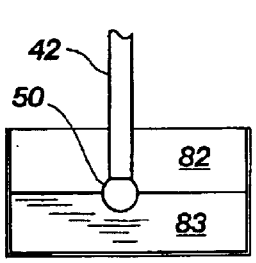
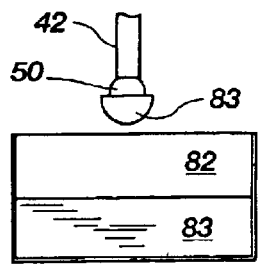
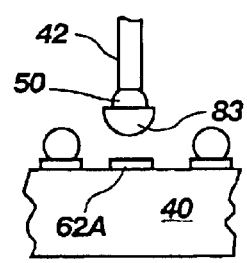
Fig. 11  Fig. 12  Fig. 13
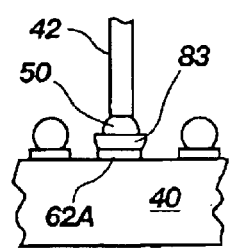
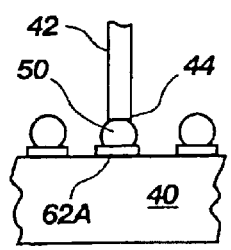
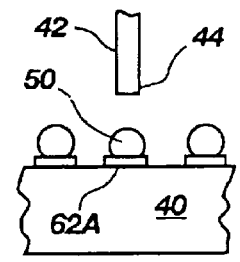
Fig. 14  Fig. 15  Fig. 16

INDIVIDUAL SELECTIVE REWORK OF DEFECTIVE BGA SOLDER BALLS

CROSS-REFERENCE TO RELATED APPLICATION

This application is a continuation of application Ser. No. 09/694,113, filed Oct. 20, 2000, now U.S. Pat. No. 6,685,080, issued Feb. 3, 2004.

BACKGROUND OF THE INVENTION

1. Field of the Invention

This invention relates generally to semiconductor device manufacturing. More particularly, the instant invention pertains to methods and apparatus for removal and replacement of individual, defective solder balls on an electronic component.

2. State of the Art

Integrated circuit semiconductor devices (ICs) are small electronic circuits formed on the surface of a wafer or other substrate of semiconductor material such as silicon, gallium arsenide or indium phosphide. The IC devices are fabricated simultaneously in large numbers in wafer form in an array over the active surface of the wafer and tested by a probe to determine electronic characteristics applicable to the intended use of the ICs. The wafer is then subdivided or "singulated" into discrete IC chips or dice, and then further tested, assembled with other components and packaged for customer use through various well-known individual die IC testing and packaging techniques, including leadframe packaging (conventional and leads-over-chip, or LOC), Chip-On-Board (COB) packaging, and flip-chip packaging. Depending upon the relative die and wafer sizes, each wafer is singulated into at least a few dozen dice, as many as several hundred dice, or even as many as several thousand discrete dice when large (such as 30 cm) wafers are employed.

Mechanical and electrical interconnection of discrete semiconductor dice with a carrier substrate, such as a printed circuit board (PCB), is often accomplished with an array of solder balls or bumps projecting from the active surface of the semiconductor die, these external interconnection elements usually having a spherical or near-spherical shape, although other shapes are known. Such a package comprises the aforementioned flip-chip package, so called because the semiconductor die or chip is mounted active surface down over the carrier substrate, supported by the solder balls or bumps. State of the art flip-chip packages may comprise so called "chip-scale" packages, wherein the lateral footprint of the package is the same as, or minimally larger than, the lateral dimension of the semiconductor die itself.

Several methods for forming solder balls or bumps on a workpiece are well known. In the early art, a preformed solder ball was manually placed on a semiconductor die using a forceps or pincer. In later developments, preformed balls have been deposited on bond pads on a semiconductor substrate using a single-ball mounting head or full ball grid array (BGA) mounting head, using vacuum to retain the ball(s) on the head prior to placement on the workpiece. Flux is applied either to the pads or the balls prior to ball placement.

Mounting heads configured to simultaneously apply all balls of a BGA for a semiconductor die are preferred because of savings in labor costs. In the current state of the art, ball grid arrays may even be formed on all of the dice of a full wafer prior to semiconductor die singulation therefrom. Thus, upwards of 10,000 balls may be placed on a wafer prior to the singulation process.

Currently, solder balls may be formed on a workpiece by processes of evaporation, electroplating, stencil printing and serial methods. Each of these processes has particular limitations.

In one version, the solder balls are temporarily fastened to the bond pads of a die by heating to a softening temperature and/or by compression during application. The die with the array of balls placed thereon is then subjected to a thermal "reflow" step to return the balls to substantially spherical shape and then cooled to harden the balls.

In another version, a solder paste preform of any shape may be placed on a metallized bond pad and melted to form a globular or "ball" shape fixedly attached to the bond pad. The ball shape is affected by surface tension of the solder and solder-wettable bond pad or cup-shaped receptacle on the semiconductor die. Alternately, other non-solder wettable passivation materials surrounding a bond pad or receptacle may be utilized to assist in preventing undue solder spread or collapse into adjacent balls (resulting in short-circuits) or damage to the die surface surrounding the balls.

Numerous problems may occur in forming a BGA of a large number of balls on a semiconductor die, wafer or other workpiece, and in the subsequent attachment of the BGA to a carrier substrate. The following discussion pertains to merely a few of such problems.

Where a perforated multiple ball vacuum pickup head is used to simultaneously place all of the BGA's solder balls on a workpiece, a common complaint is that one or more ball-retaining holes is not filled, resulting in workpiece bond pads or other terminal areas devoid of solder balls. In U.S. Pat. No. 4,871,110 to Fukasawa et al., a proposed solution is to provide a second perforated plate above the pickup head to retain the balls therein while sweeping extra balls across the surface to ensure that all holes are filled.

U.S. Pat. No. 5,284,287 to Wilson et al. denotes two problems: nonpickup of solder balls by a multi-ball pickup tool and loss of solder balls while contacting them with flux in a flux bath. In the Wilson patent, solder balls are only partially submerged in the flux and never touch the bottom of the flux bath.

U.S. Pat. No. 5,467,913 to Namekawa et al. discloses a solder ball attachment apparatus in which flux is separately applied to each pad on the semiconductor substrate prior to attaching the solder balls.

U.S. Pat. No. 5,680,984 to Sakemi is directed to a solder ball attachment method using a multi-ball head. The solder balls on the head are dipped in flux prior to placement and reflow. The Sakemi patent notes that when a solder ball is lost in the flux bath, it is recovered in a groove by wiping with a squeegee. No mention is made of what is done to correct the pickup head having an incomplete array of solder balls.

Single-ball pickup heads are known in the art for the purpose of placing solder balls on conductive pads of a workpiece. An example of such is described in U.S. Pat. No. 5,506,385 to Murakami et al. in which vacuum is used to hold a solder ball on a tubular pickup head. While sometimes useful where the number of solder balls on the workpiece is few, its use in forming multi-ball BGAs is contraindicated, being generally very slow, labor-intensive, and expensive. In the Murakami et al. reference, the apparatus uses a spring-biased head which holds a single solder ball, picked up from one of a series of containers holding balls of differing sizes. Flux is applied to each pad, followed by application of a solder ball and thermal reflow resulting from a laser beam focused on the ball.

U.S. Pat. No. 5,695,667 to Eguchi et al. describes an apparatus for forming a BGA of solder balls on a workpiece. A first multi-ball pickup head is utilized to apply the majority of balls to the workpiece. A camera is used to detect empty pads (i.e., having balls missing therefrom). A second, single-ball pickup head is used to fill in empty spaces, and the workpiece is heated in a furnace to reflow all of the solder balls.

Solder balls installed on the workpiece may be defective in various ways. For example, a ball may be undersized (and, thus, not be adequately connected to both a die and the carrier substrate during bonding), or the ball may be oversized (and prevent other adjacent balls from being adequately bonded to the carrier substrate or spread to contact an adjacent ball). The solder ball may also be irregular in shape, resulting in defective bonding. In addition, a solder ball may contain a surface inclusion which prevents or inhibits proper reflow. A solder ball may also be misaligned with its pad, resulting in defective contact therewith. In the current state of the art, such defects are simply dealt with by removing all of the solder balls on a given workpiece and starting over. The "repair" is thus very time-consuming, material-consuming and expensive. None of the above-indicated references appear to recognize or address such problems.

The current emphasis on increased miniaturization and sophistication of integrated circuits has resulted in a continuing reduction in device dimensions, ball diameter and ball spacing (pitch), and increasing numbers of balls in a BGA. As the ball size is decreased, the relative nonuniformity in ball dimensions has been observed to increase. Likewise, as pitch becomes finer, a much greater precision in ball placement is required, inasmuch as lateral ball-to-ball contact must be avoided. The increased numbers of balls required to be transferred to each semiconductor die enhances the opportunity for missed solder balls, extra solder balls, and solder balls outside of the acceptable ranges of size or shape. Thus, the problems indicated hereinabove are exacerbated by the ongoing commercial race to further miniaturize and densify semiconductor devices and the like.

The BGA format has been used with discrete conductive elements other than solder balls, such as conductive epoxy bumps, conductor-filled epoxy bumps and the like, each of which presents its own set of problems. However, solder balls, such as are formed of tin/lead alloy compositions, remain the most widely used conductive elements in BGA constructions. This is primarily because solder is relatively inexpensive and the technologies for ball formation and placement are well developed.

The use of flip-chip technology with solder balls has numerous advantages for interconnection, as compared to conventional leadframe type packages. Flip-chip provides improved electrical performance for high frequency applications such as mainframes and computer workstations. In addition, easier thermal management and reduced susceptibility to electromagnetic interference (EMI) and radiofrequency interference (RFI) emissions are inherent. Furthermore, small solder balls may be densely packed in a BGA array within the footprint of a semiconductor die, which approach conserves surface area ("real estate") on a carrier substrate and permits a greater number of dice to be placed on a substrate while providing a number of I/Os for each die well in excess of that achievable using leadframes.

Various automation systems have been developed for accurate aligning and joining the solder balls of an installed BGA to the contact sites of a substrate. For example, U.S. Pat. No. 4,899,921 to Bendat et al. discloses a slender optical probe which is inserted between a semiconductor die and a substrate to be joined. Superimposed video images of the die and the substrate permit the two members to be accurately aligned while they are narrowly separated. The probe is retracted and the two members brought together and joined.

In another system disclosed in U.S. Pat. No. 5,894,218 to Farnworth et al., an apparatus for aligning and positioning a die on a temporary test package utilizes video representations of the die surface and the test package to which the die is to be joined.

BRIEF SUMMARY OF THE INVENTION

The present invention provides a method and apparatus for fabricating a reliable interconnect assembly comprising a BGA on a semiconductor die, larger semiconductor substrate, carrier substrate or other electronic component workpiece.

More specifically, the present invention provides a method for extracting and disposing of single defective solder balls placed on or attached to attachment sites (e.g., pad or receptacle) of a BGA on a semiconductor die, larger semiconductor substrate, carrier substrate or other electronic component workpiece.

In this discussion, the term "defective ball" refers to a solder ball which has a high probability of causing difficulties in bonding to a carrier substrate, testing and subsequent use. Thus, a defective solder ball includes one which is outside of the acceptable limits of size, shape, composition, surface finish and included contaminants, is inaccurately placed or misjoined to the attachment site on the workpiece.

The present invention also provides a method for accurately placing a nondefective solder ball on an attachment site vacated by a previously extracted, defective solder ball.

The method of the invention is applicable to any BGA, irrespective of the type of workpiece and the specific method by which the solder balls were previously attached to the workpiece. In addition, the method is generally applicable to thermally softened solder balls of any size, shape, or composition useful in the semiconductor art.

In a method of the invention, a single-ball extractor/placer apparatus with a corrosion-resistant capillary tube, heater, and optional vacuum source may be used. A BGA formed on a workpiece is first scanned or otherwise tested to detect and identify the position of any defective solder balls. A capillary tube of the extractor/placer apparatus is then positioned over the defective solder ball and lowered to contact the solder ball and apply heat to soften or melt the solder ball. In one embodiment, capillary action alone may be employed to remove a completely melted solder ball from the workpiece. Optionally, vacuum suction may be applied to the solder ball through the capillary tube and, as heat is applied to soften or melt the ball, assist in releasing it from the attachment site. In either instance, the capillary tube, with either the melted ball material therein or a softened defective ball held thereon, is then lifted and moved to a location where the ball material or ball is released, such as into a waste solder container.

The single-ball vacuum extractor/placer apparatus may then be used to affix a nondefective replacement solder ball to the vacated attachment site. A fresh, nondefective solder ball is picked up by the capillary tube using a vacuum drawn therethrough. Flux is applied to the vacated site or to the solder ball held by the capillary tube, and the capillary tube lowered to place the ball in the desired site. Heat may be applied by the heater to temporarily or permanently (through reflow) bond the replacement solder ball to the workpiece. Alternatively, the reflow step may be accomplished in a furnace. The result is a workpiece in which defective solder balls are quickly and inexpensively replaced without wasting a large number of nondefective balls and without reprocessing the entire workpiece.

An extractor/placer apparatus may be operated manually or may include various degrees of automation in the steps of identifying defective balls, as well as extracting and replacing solder balls identified as being defective.

Exemplary apparatus for performing the identification, extraction and placement steps as disclosed herein are also contemplated as within the scope of the present invention, without limiting the present invention to the examples described.

BRIEF DESCRIPTION OF THE SEVERAL VIEWS OF THE DRAWINGS

The following drawings illustrate various features of the invention, wherein:

FIGS. 5 through 16 are schematic side views of a capillary tube illustrating the steps relating to the extraction and replacement of a solder ball in a BGA in accordance with a method of the invention, wherein:

FIG. 5 illustrates the approach of a capillary tube to a defective solder ball;

FIG. 6 illustrates the seating of a defective solder ball on a capillary tube;

FIG. 7 illustrates the softening and extraction of a defective solder ball by a capillary tube;

FIG. 8 illustrates the disposal of a defective solder ball;

FIG. 9 illustrates the attraction of a nondefective solder ball in a ball reservoir by a capillary tube;

FIG. 10 illustrates the removal of a nondefective solder ball from a ball reservoir by a capillary tube;

FIG. 11 illustrates the insertion of a nondefective solder ball into a flux reservoir;

FIG. 12 illustrates the removal of a nondefective solder ball with attached flux from a flux reservoir;

FIG. 13 illustrates the alignment of a fluxed solder ball with a vacated attachment site of a BGA;

FIG. 14 illustrates the contact of a fluxed nondefective solder ball with a vacated attachment site of a BGA;

FIG. 15 illustrates the thermal reflow of a fluxed nondefective solder ball with a vacated attachment site of a BGA;

FIG. 16 illustrates the retraction of a capillary tube from the reworked attachment site of a BGA;

DETAILED DESCRIPTION OF THE INVENTION

Figure 1:
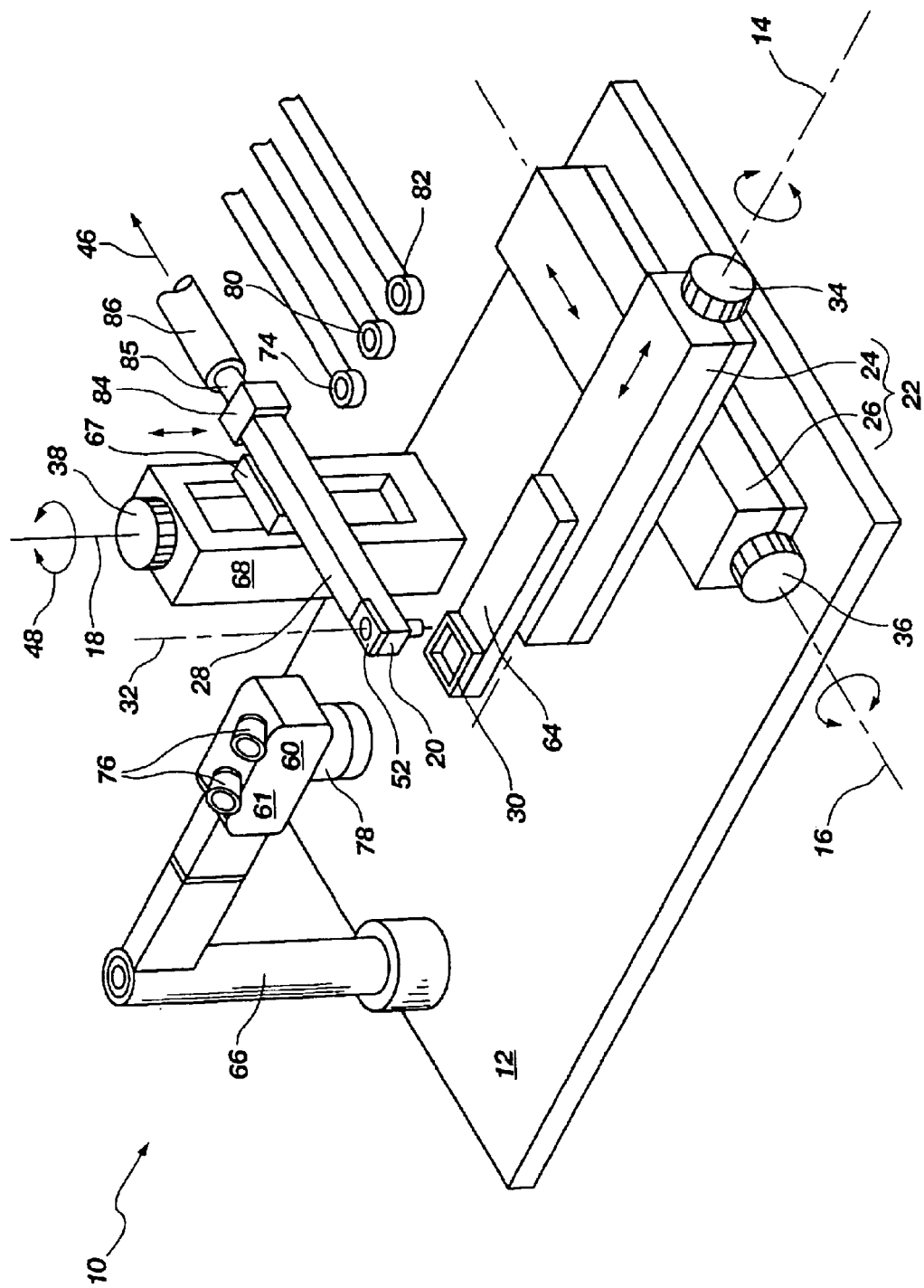
FIG. 1 is a schematic isometric view of an exemplary apparatus for extracting and replacing a defective solder ball from a ball grid array in accordance with a method of the invention.

The invention comprises an improved method and apparatus for reworking a BGA including one or more defective solder balls mounted on conductive sites on a surface of a workpiece. The workpiece may be, for example, a semiconductor die or a carrier substrate bearing circuit traces such as a printed circuit board. Usually, only a small fraction of semiconductor devices employing BGA's have defective solder balls, and very few devices have more than a few defective balls. The method of this invention permits easy extraction and replacement of only the defective balls, without removal of or adverse effects on the good (nondefective) solder balls.

More specifically, the invention pertains to a method for identifying, extracting and replacing a defective solder ball (s) of a BGA on a workpiece. A defective solder ball is broadly defined as a solder ball which, unless corrected, will probably impair an operable, robust connection through that solder ball to a conductive site when the BGA of the workpiece (semiconductor die or other substrate) is bonded, flip-chip style, to a corresponding pattern of conductive sites on a carrier substrate. Unless removed and replaced with a nondefective solder ball, the defective solder ball may result in short-circuiting, open-circuiting or other problems, rendering useless the assembly of the die and the carrier substrate, as well other dice connected to the carrier substrate, such as in the case of a multi-chip module. The current practice of removing all of the solder balls of a BGA when only one or a few are defective, cleaning the workpiece, and then replacing all of the solder balls is time-consuming, expensive, and wasteful of materials.

In the method of the invention, each defective solder ball is individually identified, extracted from the workpiece, disposed of, and replaced by a fresh solder ball.

The method of the invention preferably utilizes an apparatus which will be denoted herein as an extractor/placer apparatus 10.

As depicted in FIGS. 1, 2, 3 and 4, an exemplary manually operated solder ball extractor/placer apparatus 10 includes a base 12 and a workpiece holder 30, such as a "precisor," for retaining a workpiece 40 during extraction of one or more defective solder balls 50A, 50B, 50C, etc., and replacement with good or nondefective solder balls 50. The workpiece holder 30 is shown as being attached to positioner 22 through precisor arm 64. Positioner 22 controls the movement of the workpiece holder in X-axis 14 and Y-axis 16. Positioner 22 includes Y-axis positioner 26 mounted on base 12, and X-axis positioner 24 mounted on the Y-axis positioner. The X-axis positioner 24 is moved by rotation of actuator knob 34, and the Y-axis positioner is moved by rotation of actuator knob 36 for alignment of a ball attachment site 62 (see FIGS. 2 and 3) on a workpiece 40 with vertical axis 32 through a pickup head 20 described below.

Figure 2:
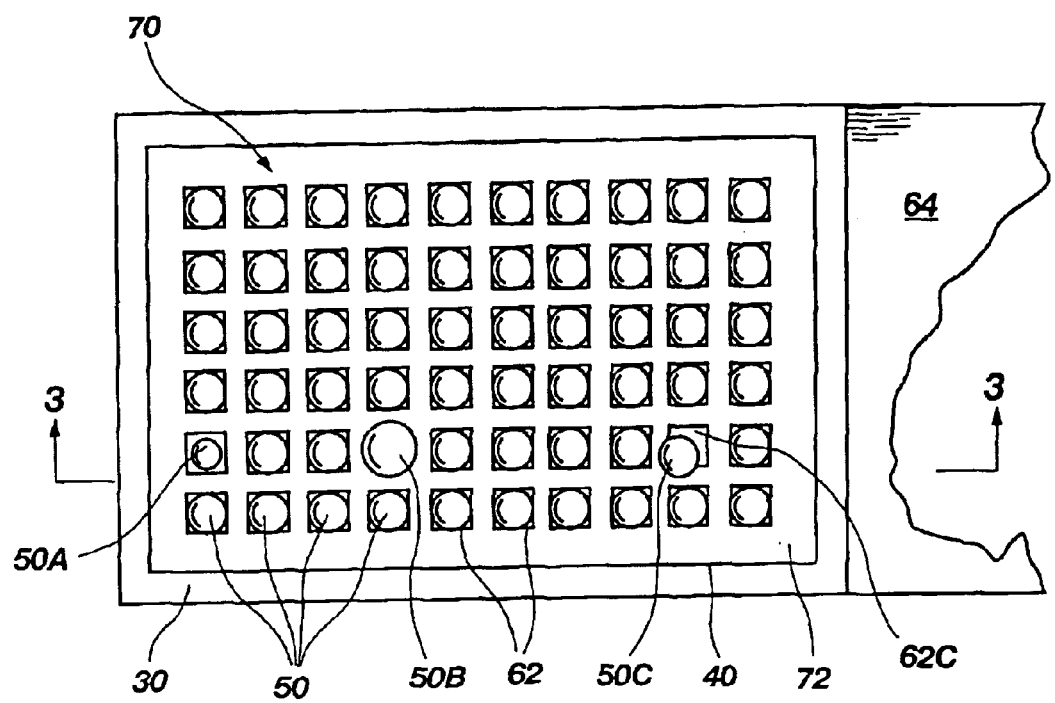
FIG. 2 is a top view of a workpiece holder with a semiconductor die having a BGA thereon including defective solder balls to be extracted and replaced in accordance with a method of the invention.
Figure 3:
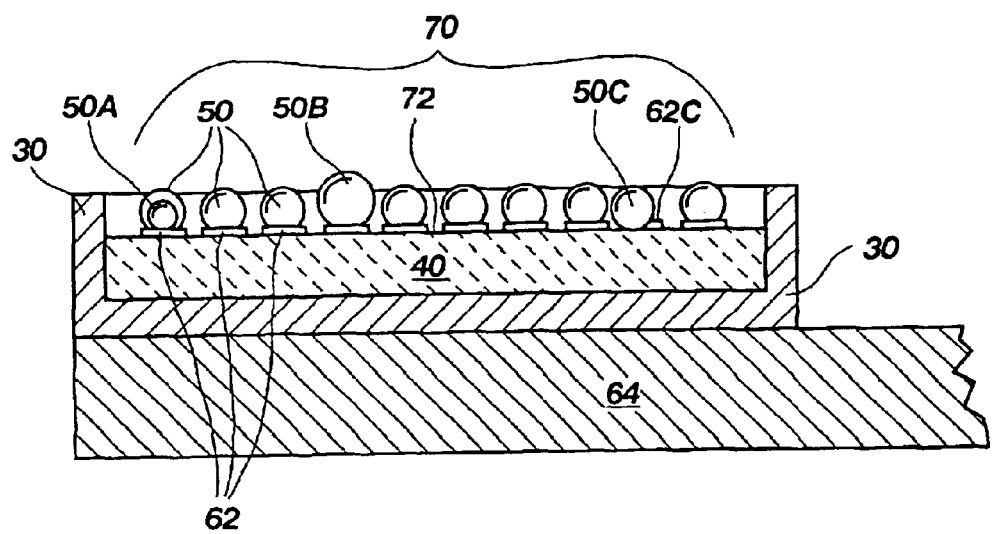
FIG. 3 is a cross-sectional side view of a workpiece holder with a semiconductor die having a BGA thereon including defective solder balls to be extracted and replaced in accordance with a method of the invention, as taken along line 3—3 of FIG. 2.

In FIGS. 2 and 3, a workpiece 40, typically a semiconductor device such as a chip-scale package, is mounted on a workpiece holder 30. An arrangement or pattern comprising a BGA 70 of solder balls 50 is shown attached to attachment sites 62 on the active surface 72 of the workpiece. Typically, the solder balls 50 are installed simultaneously with a multi-ball tool. The BGA 70 is depicted for exemplary purposes as having three defective solder balls respectively identified by the numerals 50A, 50B and 50C. Ball 50A represents an undersized ball which will not make a connection during bonding of the BGA 70 to the bonding sites of a substrate. Solder ball 50B represents an unacceptably large or oversized ball, whose height may prevent adjacent solder balls 50 from bonding with the substrate. Solder ball 50C represents a ball which is out of alignment with the attachment site 62C and has run onto the active surface. During bonding with a substrate, solder ball 50C may become undesirably electrically connected to an adjacent solder ball 50, or it may not make acceptable contact with the carrier substrate.

Figure 4:
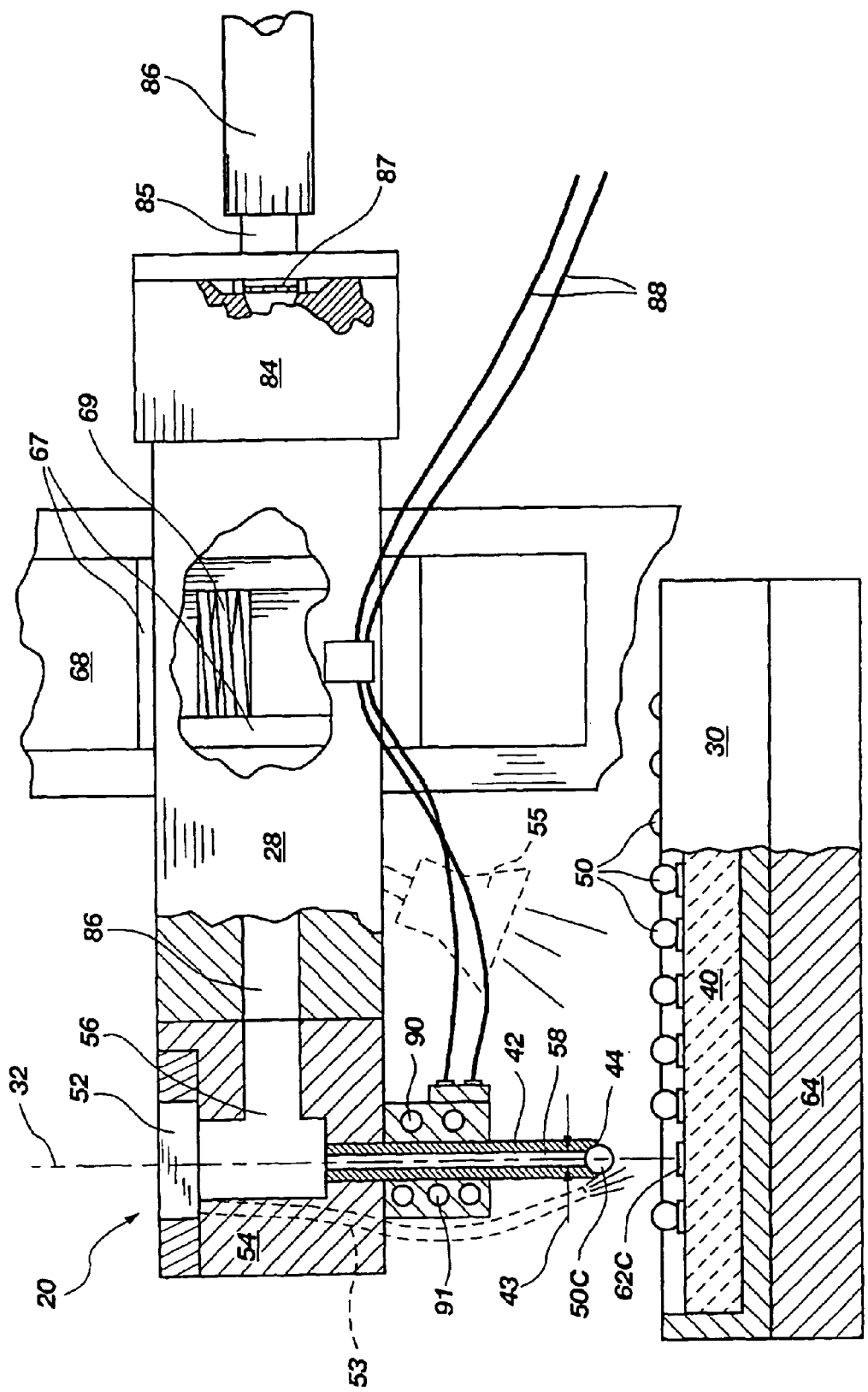
FIG. 4 is a partially sectioned, partially cutaway side view of a ball pickup tool following extraction of a defective solder ball from a BGA on a workpiece in accordance with the method of the invention.

As indicated above and as shown in FIGS. 1 and 4, the extractor/placer apparatus 10 also includes a ball pickup tool or contact head 20 which is attached through tool arm 28 to Z-axis positioner 68. The ball pickup head 20 is controllably movable along vertical Z-axis 18 by rotation of actuator knob 38 and may optionally be controllable in a rotational direction 48 about Z-axis 18. The pickup head 20 includes a hollow capillary tube 42 having an inside diameter 43 which is less than any ball diameter to be encountered, enabling a solder ball 50 to be retained at the lower end 44 of the capillary tube 42. The lower end 44 is configured as a seat for supporting a solder ball or other solder preform 50 by suction force from a vacuum or negative pressure source 46 (see FIG. 17). The capillary tube 42 is preferably formed of a corrosion-resistant material such as a stainless steel.

Also shown in FIG. 1 is a microscope 60 which is useful for inspecting a BGA on workpiece 40 to visually detect defective solder balls 50A, 50B or 50C, for aligning the capillary tube 42 to a defective solder ball 50A, B or C or to a vacant attachment site 62, and for determining the proximity of capillary tube 42 to a solder ball 50. The microscope 60 may include an integral camera 61, not separately visible, both supported by support 66, and a closed circuit television display 98 (CCTD) with memory (see FIG. 17) for use in inspecting the workpiece 40 to identify and retain the locations of defective solder balls 50A, 50B, 50C, etc. and to permit accurate positioning of the capillary tube 42 relative to any defective solder ball 50A, 50B, 50C, and an attachment site 62. In one embodiment, the microscope 60 may be focused through the capillary tube 42 to align a defective ball with the capillary tube axis 32 and determine proximity of a ball 50 on workpiece 40 to the capillary tube 42.

As shown in FIG. 1, the exemplary extractor/placer apparatus 10 may also include a ball reservoir 80 for supplying a fresh solder ball 50 to the capillary tube 42, a flux reservoir 82 into which a fresh solder ball 50 may be dipped, and a defective ball receptacle 74 for receiving defective solder balls extracted by the capillary tube. As shown, each of the ball reservoir 80, flux reservoir 82 and receptacle 74 may be movable to be more easily accessed by the capillary tube 42. Different apparatus may be used for these purposes as known in the art.

The exemplary single-ball pickup or contact head 20 illustrated in FIG. 4 comprises a body 54 attached to tool arm 28. A hollow capillary tube 42 is attached to body 54 and may be interchangeable with capillary tubes of different sizes for use with different sizes of solder balls 50. The interior 58 of the capillary tube 42 has a diameter 43 and communicates with internal chamber 56, fitting 85 and thereby to conduit 86 leading to vacuum source 46 (see FIGS. 1 and 17). The lower end 44 of the capillary tube 42 may be configured as a partially spherical seat to more securely hold a solder ball 50 under vacuum. As noted above, a solder ball 50A, 50B, or 50C may be melted by contact with capillary tube 42, and the molten solder material drawn by capillary action alone or with vacuum assist into the interior or bore 58 to be subsequently expelled therefrom as waste material. Alternatively, a gentle vacuum may be applied through capillary tube 42 so that a softened or partially melted solder ball 50A, 50B, or 50C will be held at the end 44 of the capillary tube 42, but molten solder in or on the ball will not generally be sucked through the capillary tube. The capillary tube 42 is formed of a corrosion-resistant, highly heat-conductive material such as stainless steel. A particulate filter 87 in filter housing 84 is positioned to intercept bits of solder, flux, solder paste, dust, etc., which may be sucked into the capillary tube 42 when vacuum source 46 is placed into communication therewith.

A precision ground, clear glass window 52 provides access for a vertical microscope view into the chamber 56 and through the capillary tube 42 to a solder ball 50 or attachment site 62 below the tube end 44 and along capillary tube axis 32. Microscope 60 preferably includes an integral, focused light source 78 as known in the art, light source 78 being able to illuminate workpiece 40, preferably through clear glass window 52 and aligned capillary tube 42 or, optionally, through optical fibers 53 (shown in broken lines) extending from window 52 to locations adjacent capillary tube 42 and focused adjacent the end 44 thereof. Another approach is to illuminate workpiece 40 using a light source 55 (shown in broken lines in FIG. 4) carried by tool arm 28.

Tool arm 28 and attached slider bar 67 are vertically movable relative to Z-axis positioner 68. In addition, tool arm 28 is configured to be spring-biased so that when the capillary tube 42 is lowered onto a solder ball 50, the low resistance to compression of the spring will be absorbed to prevent the ball from being unacceptably deformed. The spring-biasing apparatus may be of any workable design, but is shown by way of example as a biasing spring 69 mounted between the tool arm 28 and a slider bar 67 such that upward forces on the capillary tube 42 will be absorbed and cushioned.

As illustrated in FIG. 4, a heater 90 surrounds a portion of capillary tube 42 to heat the latter to a temperature which will sufficiently soften, e.g., melt or reflow, a solder ball 50. The heater 90 is shown as having electric resistance elements 91 and power cords 88 leading to a controllable power supply and/or temperature display output, not shown in FIG. 4.

In an alternative method of heating a solder ball to soften, reflow or melt it, a laser device (not shown) may be oriented to direct a laser beam along axis 32 through the interior 58 of the capillary tube 42, to project on a solder ball 50 at the end 44 of the capillary tube 42.

In FIG. 4, an example of a workpiece 40 is shown with an array of solder balls 50 mounted on attachment sites 62. The workpiece 40 is mounted on workpiece holder 30. A capillary tube 42 is depicted having extracted and lifted a defective solder ball 50C from an attachment site 62C.

FIGS. 5 through 16 illustrate exemplary steps used to perform the extraction and replacement of a defective solder ball 50A in a BGA of a workpiece 40. FIGS. 5 through 16 presume that a defective solder ball 50A is not reduced to a completely molten state and drawn into capillary tube 42. However, if a defective solder ball 50A is completely melted and drawn into bore 58 of capillary tube 42, either by capillary action or application of a vacuum, the steps illustrated by FIGS. 7 and 8 are modified only in that the molten solder material is drawn into capillary tube 42 in FIG. 7 and then expelled therefrom into a defective ball receptacle 74 under positive air pressure while still in a molten state. The steps illustrated by FIGS. 5, 6 and 9 through 16 remain the same.

In FIG. 5, a particular solder ball 50A has been identified as being undersized. The vertical axis 32 of a capillary tube 42 of a ball pickup head 20 is aligned with the ball 50A. With the vacuum on, the capillary tube 42 is lowered to place the capillary tube end 44 on the defective ball 50A where the ball is attracted to the capillary tube end 44. The heater 90 (see FIG. 4) is activated to soften (e.g., melt) and detach the defective ball 50A from attachment site 62A as shown in FIG. 6. In one embodiment, a slight upward biasing force may be applied to the capillary tube 42 away from the attachment site 62A to facilitate release of a heat-softened solder ball 50A from the attachment site 62A, the capillary tube 42 and vacuum-held softened solder ball 50A then retracting slightly from attachment site 62A. Such a retraction mechanism may be in the form of a spring-loaded solenoid of which capillary tube 42 forms a part, the solenoid being powered to overcome the retractive force of the spring until retraction of a solder ball 50A is desired. Alternatively, a spring may be used to extend the capillary tube 42 until it is desired to retract the same when the solenoid is powered.

FIG. 7 depicts the defective solder ball 50A being lifted and transported to a disposal site, such as defective ball receptacle 74, shown in FIG. 8. The defective solder ball 50A is discarded by interrupting the vacuum provided to capillary tube 42. Another option, not shown, is to reverse the pressure in capillary tube 42 and use a brief puff of air from a positive pressure source to dislodge the solder ball 50A.

A nondefective (i.e., "good") solder ball 50 is then attracted by vacuum in the capillary tube 42 from a solder ball reservoir 80 (FIG. 9) and picked up from the reservoir (FIG. 10).

As depicted in FIG. 11, the capillary tube 42 then submerses a portion of the carried good solder ball 50 into flux 83 within a flux reservoir 82. When the good solder ball 50 is lifted from the flux reservoir 82 (FIG. 12), a coating of flux 83 (exaggerated for clarity) will cover a portion of the good solder ball 50, enabling effective attachment of the good solder ball 50 to a vacated attachment site 62A. Alternatively, flux may be placed on the vacated attachment site 62A prior to placement of good solder ball 50 thereon.

The fluxed, good solder ball 50 is then aligned and positioned directly over the vacated attachment site 62A, as shown in FIG. 13. The capillary tube 42 is then lowered to place the good, fluxed solder ball 50 on the attachment site 62A (FIG. 14) without placing undue compressive force on the good, fluxed solder ball 50. The biasing spring 69 serves to limit any force on the good solder ball 50 due to inadvertent overrun of the capillary tube end 44. The capillary tube 42 is heated to soften, or optionally reflow or completely melt the solder ball 50, joining it to the attachment site 62A (FIG. 15), and the capillary tube 42 is retracted (FIG. 16) to seek another defective solder ball 50 (for example, oversized solder ball 50B) or for use with another workpiece 40.

The process of locating, extracting and replacing defective solder balls 50A, 50B, 50C, etc., on a workpiece 40 may be automated to effectively accelerate the process. Various steps of the method may be automated, and an example of such method and apparatus follows.

Figure 17:
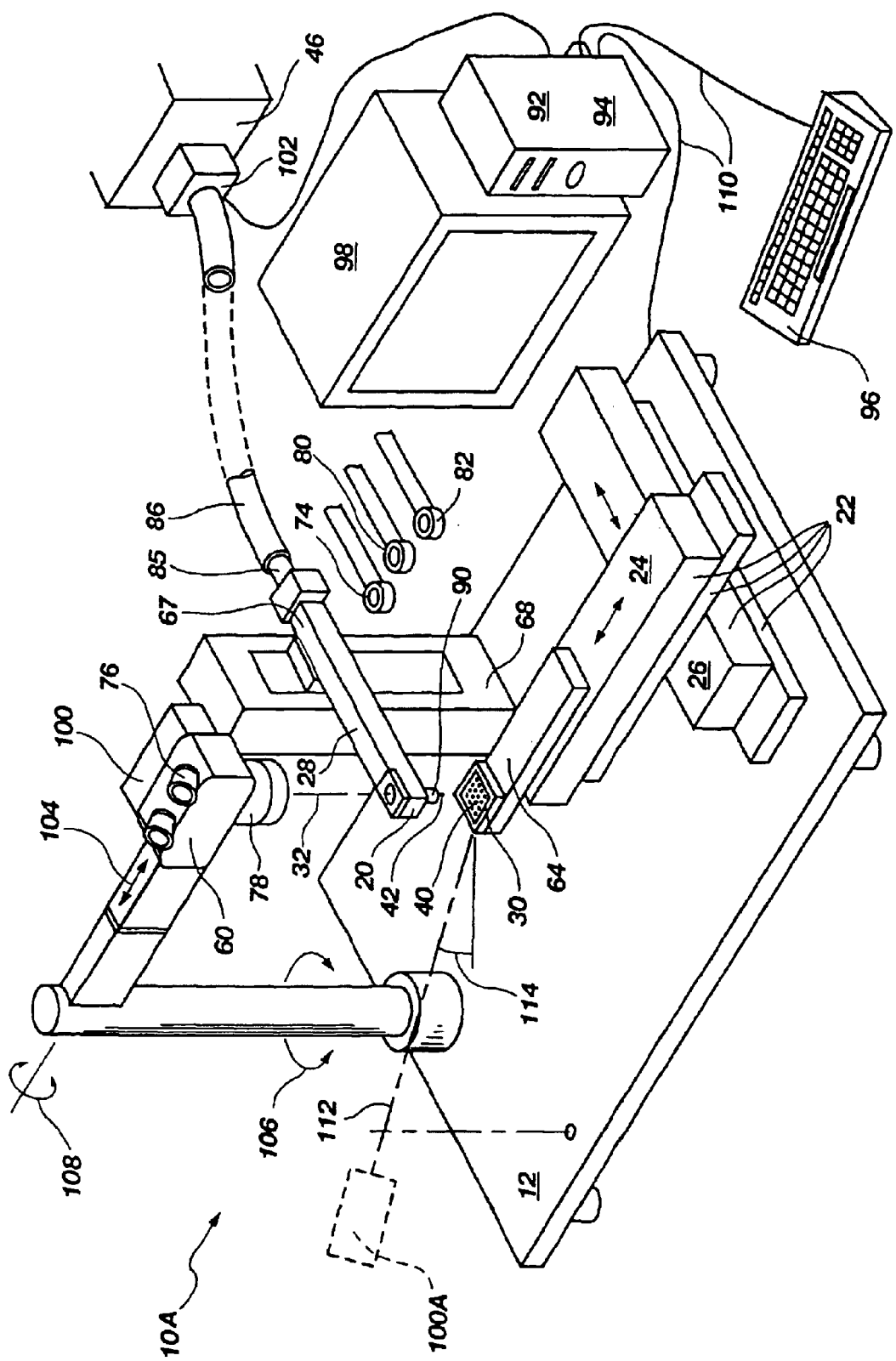
FIG. 17 is a schematic isometric view of an exemplary automated apparatus for extracting and replacing a defective solder ball from a ball grid array in accordance with a method of the invention.

As shown in FIG. 17, an extractor/placer apparatus 10A includes features of the apparatus 10 depicted in FIG. 1 and described with respect thereto, with certain additional automated features. The various components of the apparatus 10A are controlled by a computer control board 92 including at least one microprocessor, in conjunction with appropriate programs and data in associated memory storage 94. A video display 98 provides an enlarged visual output which enables easy detection of defective solder balls 50A, 50B, 50C, etc., and precise alignment of the capillary tube 42 of the ball pickup head 20.

Figure 18:
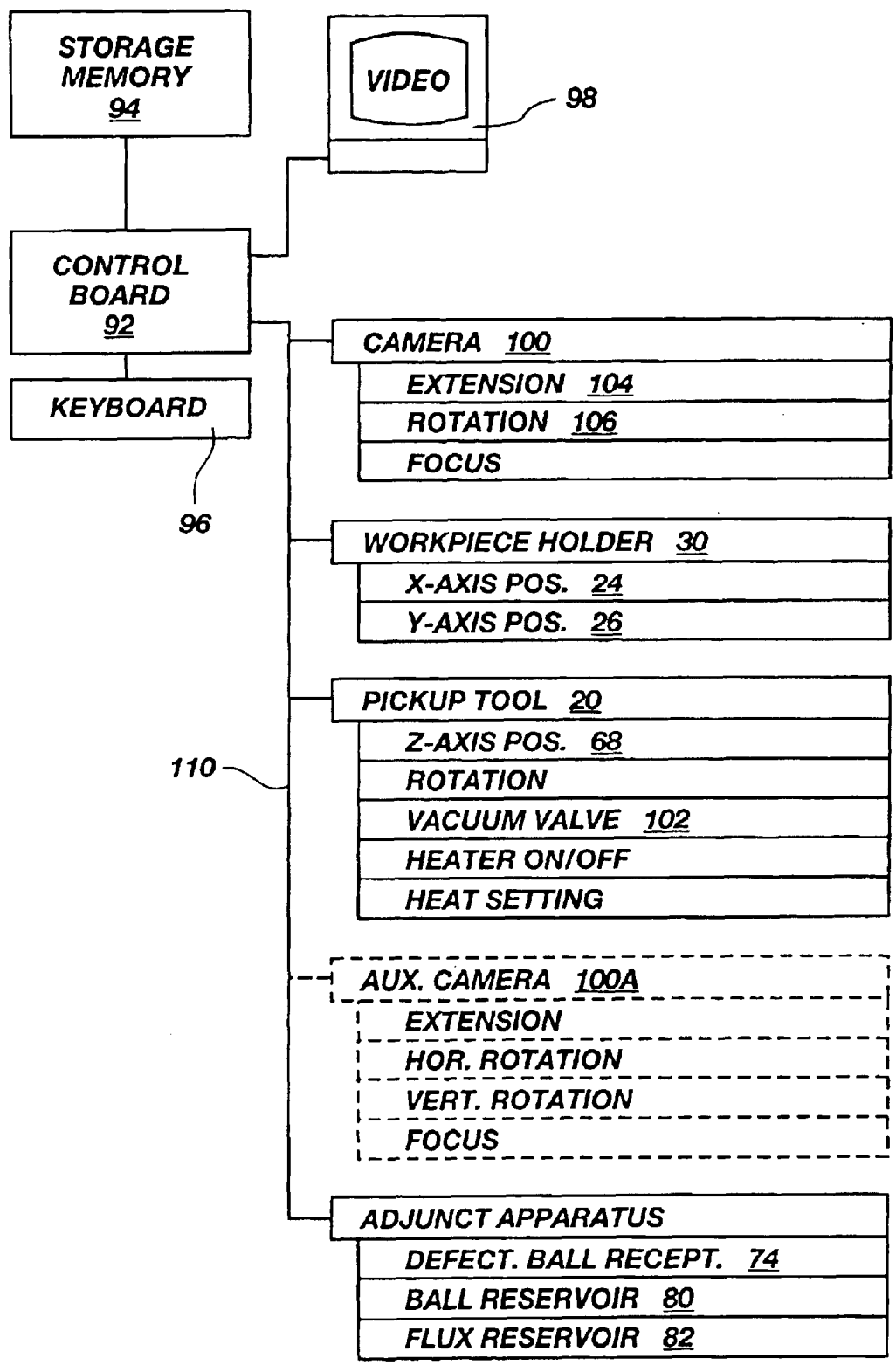
FIG. 18 is a schematic chart characterizing control routes between a computer controller and optical devices, positioners, switches and video output of an apparatus useful for extracting, removing and replacing a solder ball in accordance with a method of the invention.

FIG. 18 schematically depicts the control lines 110 linking the control board 92, memory 94, keyboard 96, video 98 and the various controlled components of apparatus 10A.

A workpiece 40 is mounted in a workpiece carrier or holder 30. The holder 30 is mounted on a workpiece positioner 22 comprising an X-axis positioner 24 and a Y-axis positioner 26, both of which are controlled by integral electric drive assemblies which may comprise, for example, linear steppers or fine-pitch screw drives. The positioner 22 is controlled by a program stored in memory in the control board 92 and/or in memory storage 94.

A microscope 60 with an associated camera 100 is positionally controlled from control board 92. Although defective solder balls may have been found in a previous inspection operation, the microscope 60 may be manually used with eyepieces 76 to verify solder ball faults. However, a video display 98 of the output of camera 100 makes the task much easier. Automated analysis using conventional "machine vision" methods may be employed in a comparison of real-time video or still photographs of the active surface of workpiece 40 with a stored digital image of a model BGA 70 to detect unacceptable variations in size and placement of solder balls 50. Digital imaging may also be employed to rapidly compare individual solder balls 50 of workpiece 40 with design specifications or for coincidence with visually perceptible defects, images of which are stored in memory storage 94. An auxiliary camera 100A may be positioned to view the workpiece 40 from an oblique angle 114, i.e., along sloping line 112. Combining the views from both cameras may enable more accurate determination of defective solder balls 50A, 50B, 50C, etc. Of course, more than one auxiliary camera may be employed to enable multiple perspective views. Microscope 60 with camera 100 is shown as laterally extendable in direction 104 and horizontally rotatable in direction 106 about a vertical axis. In addition, the microscope/camera combination may be rotated about a horizontal axis as shown by arrow 108. It may be noted that in a fully automated system, a camera without visual microscope capability may be employed as desired.

A self-contained machine vision system available from a commercial vendor of such equipment may be employed. For example, and without limitation, such systems are available from Cognex Corporation of Natick, Mass. For example, the apparatus of the Cognex BGA Inspection Package™ or the SMD Placement Guidance Package™ may be adapted to the present invention, although it is believed that the MVS-8000™ product family and the Checkpoint® product line, the latter employed in combination with Cognex PatMax™ software, may be especially suitable for use in the present invention.

It is noted that a variety of machine vision systems are in existence, examples of which and their various structures and uses are described, without limitation, in U.S. Pat. Nos. 4,526,646; 4,543,659; 4,736,437; 4,899,921; 5,059,559; 5,113,565; 5,145,099; 5,238,174; 5,463,227; 5,288,698; 5,471,310; 5,506,684; 5,516,023; 5,516,026; and 5,644,245. The disclosure of each of the immediately foregoing patents is hereby incorporated by this reference.

Vertical movement of the single-ball pickup head 20 through Z-axis positioner is controlled from the control board 92. The Z-axis positioner may also be controllably rotatable about a vertical axis as shown in FIG. 1. The capillary tube heater 90 is controllable (ON/OFF) from the control board 92, as is an ON/OFF valve 102 controlling vacuum from a vacuum source 46. In addition, movements of the defective ball receptacle 74, ball reservoir 80 and flux reservoir 82 are all controllable from the control board 92. Thus, precise positioning of the capillary tube's end 44 above any of defective balls 50A, 50B, 50C, an attachment site 62, a defective ball receptacle 74, a good ball reservoir 80, and a flux reservoir 82 is achieved.

The method of the invention may be used simply to remove solder balls from a BGA for any purpose, whether the ball is defective or good but mislocated or extraneous.

It should be noted that various terms are used herein in their broad sense. For example, the term "flux" refers to any substance used in conjunction with a solder ball at the time it is reflowed. The term "solder ball" includes not only preformed balls of solder but also solder paste pellets or other preforms used to replace a defective solder ball 50.

Use of this method results in rapid and accurate rework of a BGA 70 having defective solder balls 50A, 50B, 50C, etc. The inventive method also avoids the wastage of a large number of good solder balls 50 which occurs when an entire BGA is removed. It avoids excess use of flux from repeated attachment of the solder balls of an entire BGA. The method also avoids repeated heating of the workpiece to reflow an entire BGA for removal and then again for ball replacement, which operations may, if the heat budget for a device is exceeded, result in irreparable damage.

The methods and apparatus described herein present many advantages in reworking a BGA workpiece, including higher reliability, lower cost, reduced ball wastage, etc. As used herein, the term "BGA" means and includes any array or pattern comprising a plurality of solder balls on an electronic component workpiece and is not limited to an array comprising rows and columns of balls or any other specific pattern.

The embodiments of the invention as described herein are intended to be illustrative and not restrictive, and the scope of the invention is defined by the appended claims rather than the preceding description. Those of ordinary skill in the art will recognize and appreciate that additions, deletions and modifications to the disclosed embodiments, and combinations of features from different embodiments, are possible and easily effected without departing from the scope of the invention. All variations that fall within the metes and bounds of the subject matter claimed, or which are equivalent thereto, are, therefore, intended to be embraced by the following claims.

What is claimed is:

1. A method for replacing a solder ball, comprising:
   providing a workpiece having at least one solder ball bonded to an attachment site of the workpiece;
   extracting the at least one solder ball with a capillary tube to vacate the attachment site;
   retrieving at least another solder ball with the capillary tube;
   placing the at least another solder ball on the attachment site with the capillary tube; and
   bonding the at least another solder ball to the attachment site while holding the at least another solder ball in place with the capillary tube.

2. The method of claim 1, wherein extracting the at least one solder ball with the capillary tube comprises:
   de-bonding the at least one solder ball from the attachment site; and
   removing the at least one solder ball from the attachment site with the capillary tube by at least one of capillary action and a vacuum applied to the at least one solder ball through a bore of the capillary tube.

3. The method of claim 2, wherein de-bonding the at least one solder ball from the attachment site comprises applying heat to the at least one solder ball sufficiently to reduce the solder thereof to a molten state, and wherein removing the at least one solder ball from the attachment site comprises drawing a vacuum through the bore of the capillary tube to facilitate drawing the solder in a molten state thereinto.

4. The method of claim 2, wherein de-bonding the at least one solder ball from the attachment site comprises applying heat to the at least one solder ball to cause the at least one solder ball to release from the attachment site without completely melting, and wherein removing the at least one solder ball from the attachment site comprises drawing a vacuum through the bore of the capillary tube to lift the at least one solder ball with an end of the capillary tube.

5. The method of claim 2, wherein at least one of de-bonding the at least one solder ball from the attachment site and bonding the at least another solder ball to the attachment site comprises applying heat to the at least one solder ball or the at least another solder ball through the capillary tube.

6. The method of claim 5, wherein applying heat to the at least one solder ball or the at least another solder ball through the capillary tube comprises heating the capillary tube.

7. The method of claim 5, wherein applying heat to the at least one solder ball or the at least another solder ball through the capillary tube comprises directing a laser beam onto the at least one solder ball or the at least another solder ball through the bore of the capillary tube.

8. The method of claim 1, further comprising aligning the capillary tube with the at least one solder ball or the attachment site by viewing the workpiece through a bore of the capillary tube.

9. The method of claim 8, wherein viewing the workpiece through the bore of the capillary tube comprises viewing the workpiece with one of a microscope and a camera.

10. The method of claim 1, wherein retrieving at least another solder ball with the capillary tube comprises drawing a vacuum through a bore of the capillary tube to lift the at least another solder ball with an end of the capillary tube.

11. The method of claim 10, wherein retrieving at least another solder ball with the capillary tube further comprises applying flux to the at least another solder ball by submerging a portion of the at least another solder ball into a flux reservoir with the capillary tube prior to placing the at least another solder ball on the attachment site with the capillary tube.

12. An apparatus for extracting and replacing individual solder balls on an attachment site of a workpiece, the apparatus comprising:

a support configured to receive a workpiece thereon;

a capillary tube including a distal end configured for contacting a solder ball; and a structure configured for viewing the workpiece through a bore of the capillary tube.

13. The apparatus of claim 12, further including a vacuum source selectively operably coupled to the capillary tube for drawing a vacuum through the bore of the capillary tube.

14. The apparatus of claim 12, further comprising a heating device configured for applying heat to a solder ball through the capillary tube.

15. The apparatus of claim 14, wherein the heating device comprises a heater configured to heat the capillary tube.

16. The apparatus of claim 14, wherein the heating device comprises a laser configured to direct a laser beam through the bore of the capillary tube.

17. The apparatus of claim 12, wherein the structure configured for viewing the workpiece through a bore of the capillary tube comprises one of a microscope and a camera.

18. The apparatus of claim 12, wherein the capillary tube is mounted to a contact head configured for positioning the capillary tube over at least one of a solder ball disposal site, a solder ball reservoir, and a flux reservoir.

19. An apparatus for extracting and replacing an individual solder ball mounted on an attachment site of a workpiece, the apparatus comprising:

a support configured to receive a workpiece thereon;

a solder ball reservoir;

a contact head configured for positioning a capillary tube over the solder ball reservoir and the support, wherein the capillary tube includes a distal end configured to remove the individual solder ball from the attachment site of the workpiece and to replace the removed individual solder ball with another individual solder ball retrieved from the solder ball reservoir;

a heating device configured for applying heat to a solder ball through the capillary tube; and a vacuum source selectively operably coupled to the capillary tube for drawing a vacuum through a bore of the capillary tube.

20. The apparatus of claim 19, wherein the heating device comprises a heater configured to heat the capillary tube.

21. The apparatus of claim 19, wherein the heating device comprises a laser configured to direct a laser beam through the bore of the capillary tube.

22. The apparatus of claim 19, further comprising a window in the contact head configured for viewing the workpiece through the bore of the capillary tube.

23. The apparatus of claim 22, further comprising at least one of a microscope and a camera configured for viewing the workpiece through the bore of the capillary tube.

24. The apparatus of claim 19, further comprising a solder ball disposal site, wherein the contact head is configured for positioning the capillary tube above the solder ball disposal site.

25. The apparatus of claim 19, further comprising a flux reservoir, wherein the contact head is configured for positioning the capillary tube above the flux reservoir.

26. A method for correcting a defective ball grid array on an electronic component workpiece, the method comprising:

providing a workpiece having an array of solder balls secured thereto;

identifying at least one defective solder ball associated with a corresponding attachment site of the array of solder balls on the workpiece; and extracting the at least one defective solder ball with a first capillary tube to vacate the corresponding attachment site by individually heating the at least one defective solder ball to a molten state and removing molten solder from the corresponding attachment site into the first capillary tube by at least one of capillary action and a vacuum applied to the at least one defective solder ball through a bore of the first capillary tube.

27. The method of claim 26, further comprising replacing the at least one defective solder ball with a nondefective solder ball placed on the vacated corresponding attachment site with a second capillary tube while maintaining other solder balls of the array of solder balls in undisturbed arrayed attachment to the workpiece.

28. The method of claim 27, wherein replacing the at least one defective solder ball with a nondefective solder ball further comprises lifting the nondefective solder ball using a vacuum provided through the second capillary tube and locally heating the nondefective solder ball through the second capillary tube.

29. The method of claim 28, wherein heating the nondefective solder ball through the second capillary tube comprises heating the second capillary tube.

30. The method of claim 28, wherein heating the nondefective solder ball through the second capillary tube comprises directing a laser beam onto the nondefective solder ball through a bore of the second capillary tube.

31. The method of claim 27, wherein replacing the at least one defective solder ball with a nondefective solder ball further comprises applying flux to the nondefective solder ball by submerging a portion of the nondefective solder ball into a flux reservoir with the second capillary tube prior to placing the nondefective solder ball on the vacated corresponding attachment site with the second capillary tube.

32. The method of claim 27, further comprising aligning at least one of the first capillary tube and the second capillary tube with the corresponding attachment site by viewing the workpiece through a bore of the first capillary tube or the second capillary tube.

33. The method of claim 32, wherein viewing the workpiece through the bore of the first capillary tube or the second capillary tube comprises viewing the workpiece with one of a microscope and a camera.

* * * * *